(12) United States Patent
Dunn

(10) Patent No.: US 8,358,397 B2
(45) Date of Patent: Jan. 22, 2013

(54) SYSTEM FOR COOLING AN ELECTRONIC DISPLAY

(75) Inventor: William R. Dunn, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 347 days.

(21) Appl. No.: 12/706,652

(22) Filed: Feb. 16, 2010

(65) Prior Publication Data

US 2010/0238394 A1    Sep. 23, 2010

Related U.S. Application Data

(63) Continuation-in-part of application No. 12/411,925, filed on Mar. 26, 2009, and a continuation-in-part of application No. 12/556,029, filed on Sep. 9, 2009, and a continuation-in-part of application No. 12/234,307, filed on Sep. 19, 2008, and a continuation-in-part of application No. 12/234,360, filed on Sep. 19, 2008, and a continuation-in-part of application No. 12/237,365, filed on Sep. 24, 2008, and a continuation-in-part of application No. 12/235,200, filed on Sep. 22, 2008, and a continuation-in-part of application No. 12/620,330, filed on Nov. 17, 2009, and a continuation-in-part of application No. 12/556,209, filed on Sep. 9, 2009, and a continuation-in-part of application No. 12/641,468, filed on Dec. 18, 2008.

(60) Provisional application No. 61/152,879, filed on Feb. 16, 2009, provisional application No. 61/039,454, filed on Mar. 26, 2008, provisional application No. 61/095,615, filed on Sep. 9, 2008, provisional application No. 61/033,064, filed on Mar. 3, 2008, provisional application No. 61/053,713, filed on May 16, 2008, provisional application No. 61/057,599, filed on May 30, 2008, provisional application No. 61/076,126, filed on Jun. 26, 2008, provisional application No. 61/115,333, filed on Nov. 17, 2008, provisional application No. 61/095,616, filed on Sep. 9, 2008, provisional application No. 61/138,736, filed on Dec. 18, 2008.

(51) Int. Cl.
*G02F 1/1333* (2006.01)

(52) U.S. Cl. .......................................... 349/161; 349/58

(58) Field of Classification Search .............. 349/58–61, 349/161
See application file for complete search history.

(56) References Cited

U.S. PATENT DOCUMENTS 4,093,355  A    6/1978  Kaplit et al.
(Continued)

FOREIGN PATENT DOCUMENTS

GB    2402205    1/2004
(Continued)

OTHER PUBLICATIONS

Zeef, Hubing, EMC analysis of 18' LCD Monitor, Aug. 2000, 1 page.

*Primary Examiner* — Dung T. Nguyen
(74) *Attorney, Agent, or Firm* — Standley Law Group LLP

(57) ABSTRACT

A system for cooling an electronic display where an isolating structure may be used to allow ambient air to cool power modules. The isolating structure substantially prohibits containments which may be present within the ambient air from contacting sensitive electrical components on the power modules or otherwise. A gasket may be used to seal the interface between the power modules and the isolating structure. Heat sinks may be placed in thermal communication with the power supplies and fans may draw air through a narrow channel in which the heat sinks are located. In some embodiments the narrow channel may have the opposing surface of the channel defined by the rear portion of an LED assembly. Exemplary embodiments may use the ambient air to cool both the power modules and a closed loop of isolated gas within the electronic display.

17 Claims, 11 Drawing Sheets

U.S. PATENT DOCUMENTS

| | | |
|---|---|---|
| 4,593,978 A | 6/1986 | Mourey et al. |
| 4,634,225 A | 1/1987 | Haim et al. |
| 5,029,982 A | 7/1991 | Nash |
| 5,088,806 A | 2/1992 | McCartney et al. |
| 5,247,374 A | 9/1993 | Terada |
| 5,559,614 A | 9/1996 | Urbish et al. |
| 5,748,269 A | 5/1998 | Harris et al. |
| 5,767,489 A | 6/1998 | Ferrier |
| 5,818,010 A | 10/1998 | McCann |
| 5,869,919 A | 2/1999 | Sato |
| 5,991,153 A | 11/1999 | Heady et al. |
| 6,089,751 A | 7/2000 | Conover et al. |
| 6,157,432 A | 12/2000 | Helbing |
| 6,191,839 B1 | 2/2001 | Briley |
| 6,417,900 B1 | 7/2002 | Shin et al. |
| 6,535,266 B1 | 3/2003 | Nemeth et al. |
| 6,628,355 B1 | 9/2003 | Takahara |
| 6,839,104 B2 | 1/2005 | Taniguchi et al. |
| 6,885,412 B2 | 4/2005 | Ohnishi et al. |
| 6,943,768 B2 | 9/2005 | Cavanaugh et al. |
| 7,059,757 B2 | 6/2006 | Shimizu |
| 7,083,285 B2 | 8/2006 | Hsu |
| 7,284,874 B2 | 10/2007 | Jeong et al. |
| 2002/0101553 A1 | 8/2002 | Enomoto et al. |
| 2002/0126248 A1 | 9/2002 | Yoshida |
| 2003/0007109 A1 | 1/2003 | Park |
| 2004/0036834 A1 | 2/2004 | Ohnishi et al. |
| 2004/0165139 A1 | 8/2004 | Anderson et al. |
| 2005/0213950 A1 | 9/2005 | Yoshimura |
| 2006/0082271 A1 | 4/2006 | Lee et al. |
| 2006/0132699 A1 | 6/2006 | Cho |
| 2006/0199514 A1 | 9/2006 | Kimura |
| 2006/0209266 A1 | 9/2006 | Utsunomiya |
| 2007/0019419 A1 | 1/2007 | Hafuka et al. |
| 2007/0140671 A1 | 6/2007 | Yoshimura |
| 2007/0151664 A1 | 7/2007 | Shin |
| 2010/0182562 A1* | 7/2010 | Yoshida et al. ............ 349/161 |

FOREIGN PATENT DOCUMENTS

| | | |
|---|---|---|
| JP | 03153212 | 7/1991 |
| JP | 08194437 | 7/1996 |
| JP | 11160727 | 6/1999 |
| JP | 2002158475 | 5/2002 |
| JP | 2005134849 | 5/2005 |
| JP | 200829274 | 12/2008 |
| KR | 20060016469 | 2/2006 |
| KR | 100666961 | 1/2007 |
| KR | 1020070070675 | 7/2007 |
| WO | WO2005079129 | 8/2005 |

* cited by examiner

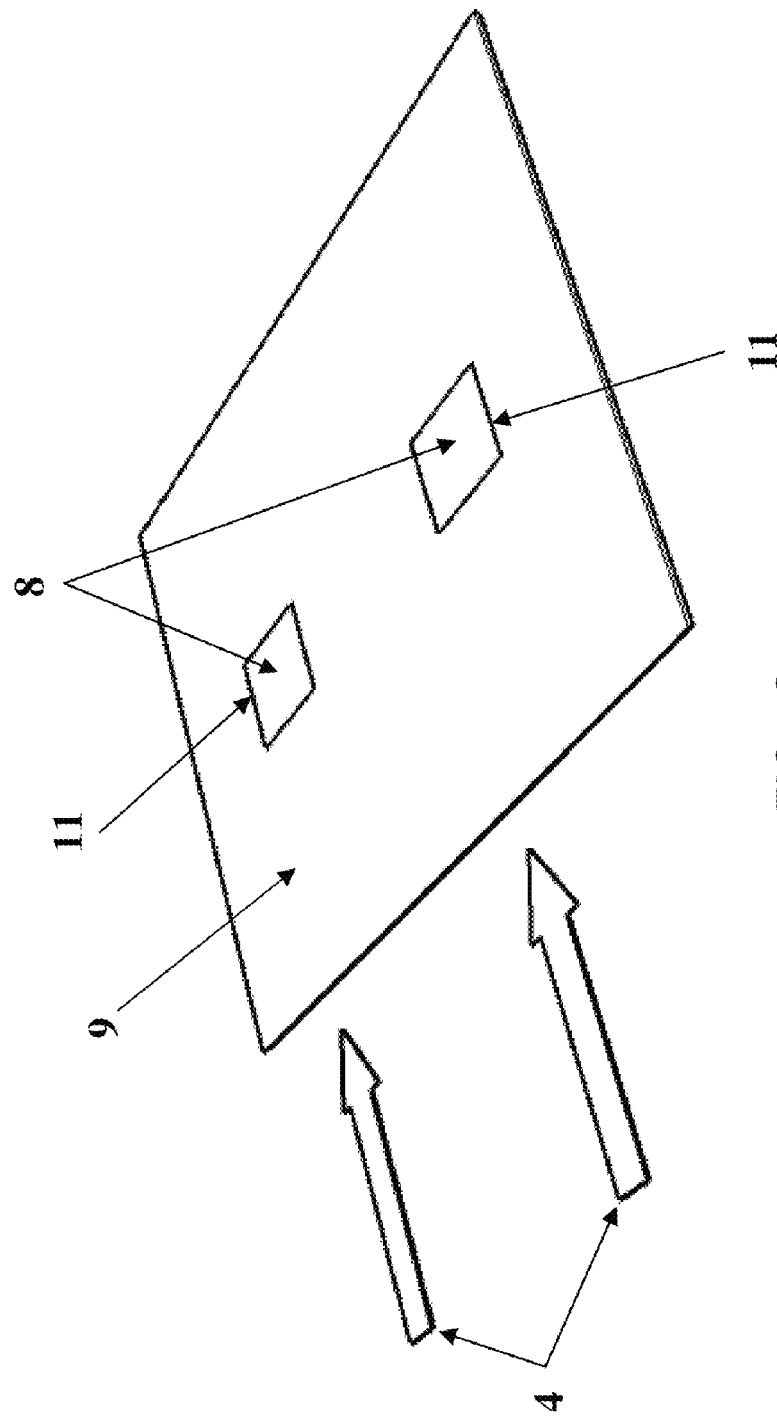

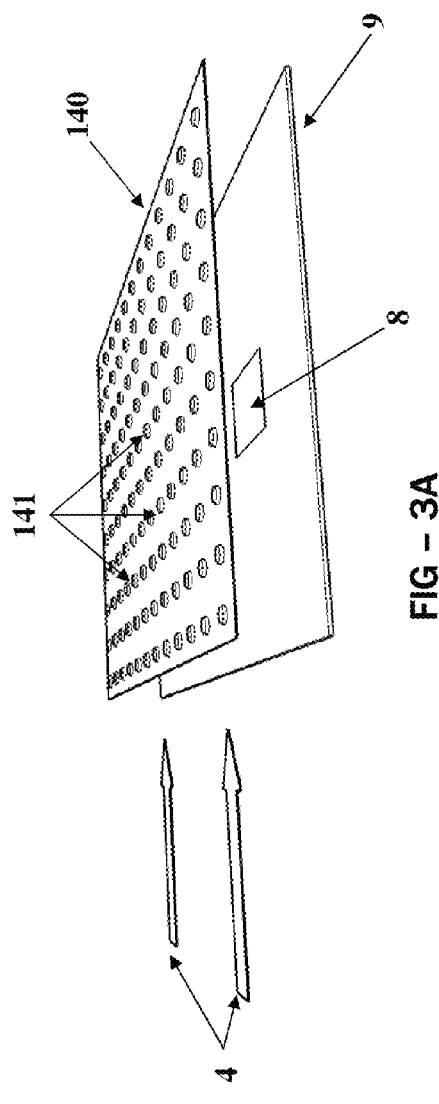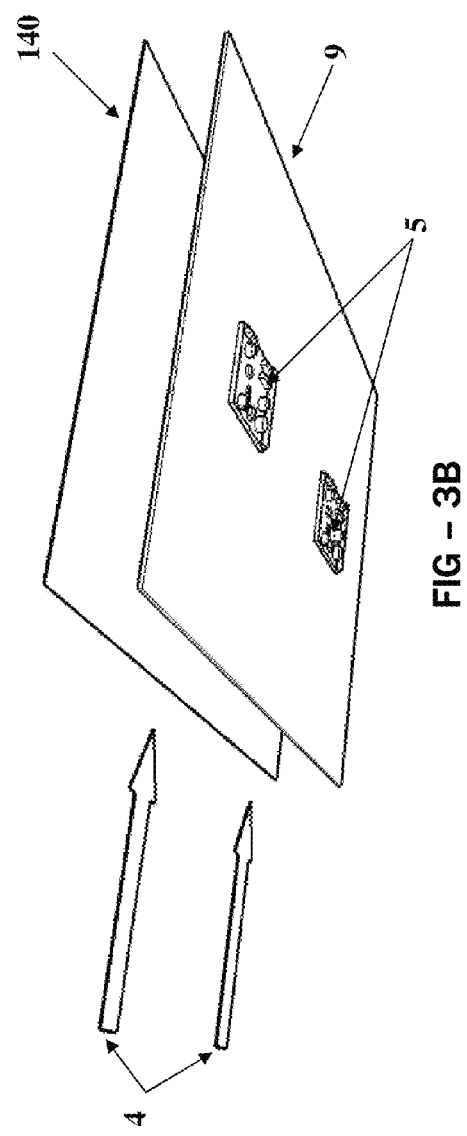
FIG – 3A
FIG – 3B

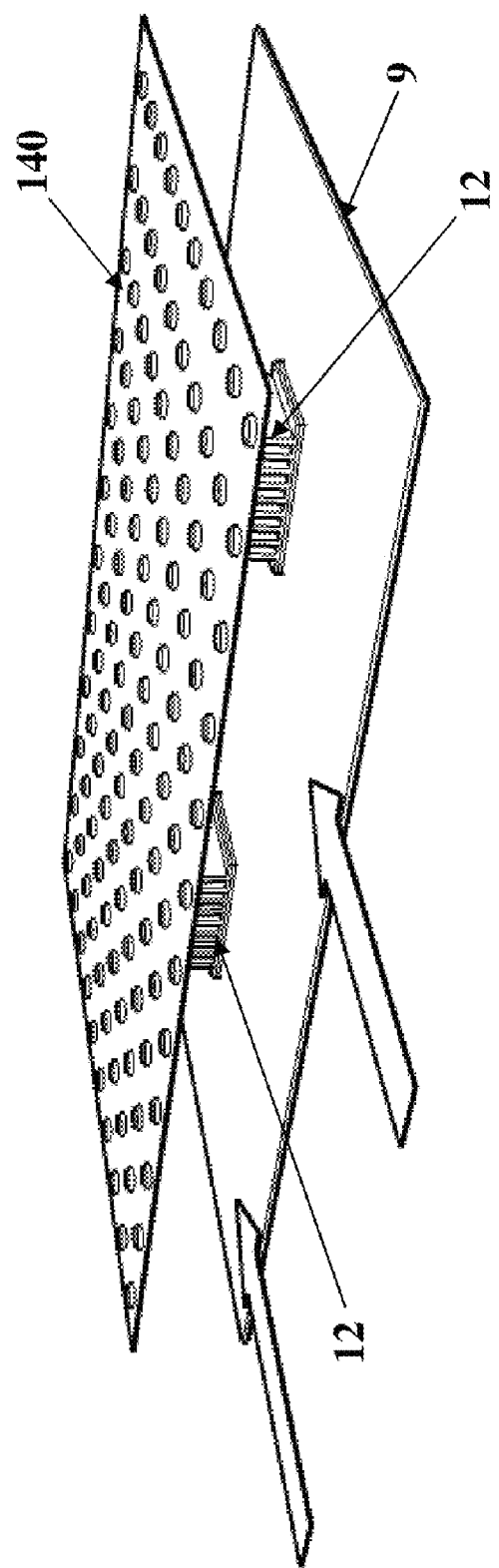

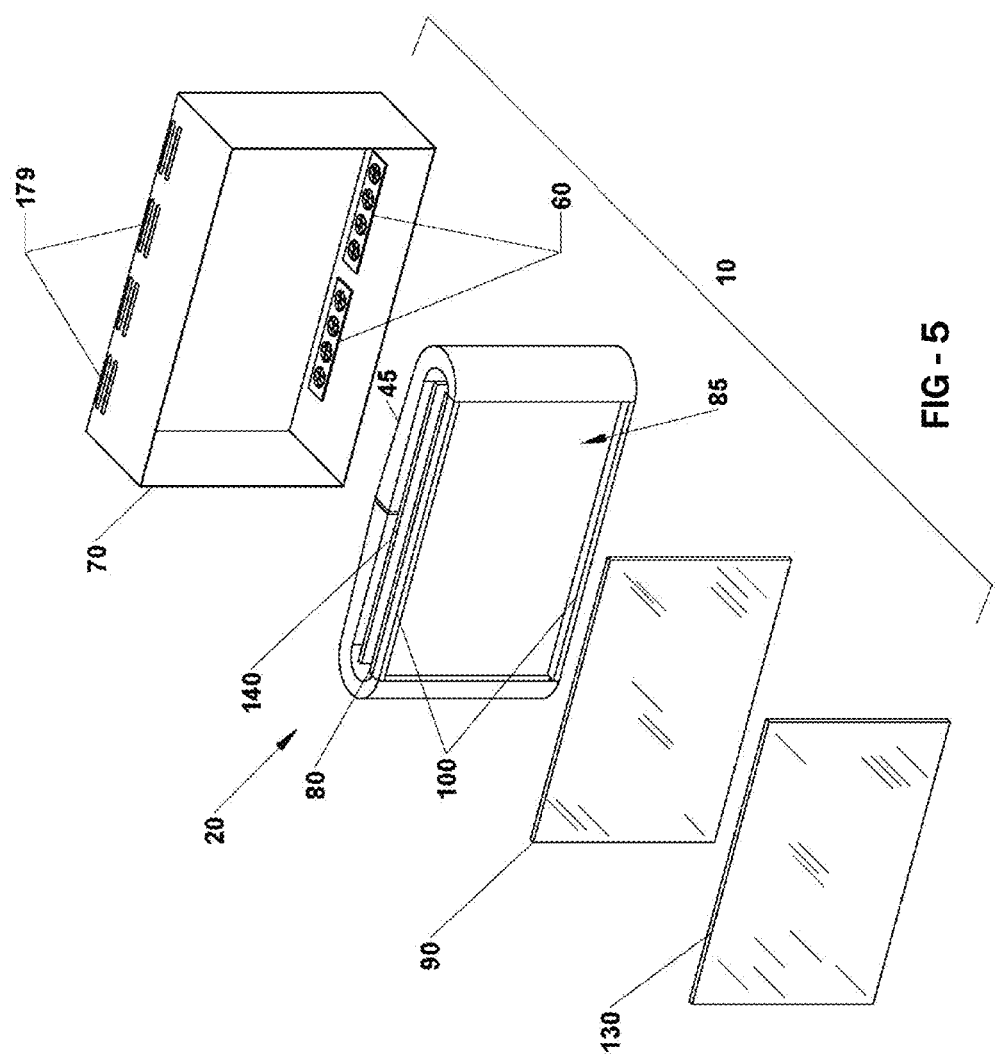

SYSTEM FOR COOLING AN ELECTRONIC DISPLAY

CROSS-REFERENCE TO RELATED APPLICATIONS

This application is a non-provisional of U.S. Application No. 61/152,879 filed Feb. 16, 2009 and is hereby incorporated by reference as if fully cited herein. This application is a continuation in part of U.S. application Ser. No. 12/641,468 filed Dec. 18, 2009 which is a non-provisional of U.S. Application No. 61/138,736 filed Dec. 18, 2008 each of which is hereby incorporated by reference as if fully cited herein. This application is a continuation in part of U.S. application Ser. No. 12/411,925 filed Mar. 26, 2009, which is a non-provisional application of U.S. provisional application No. 61/039,454 filed Mar. 26, 2008 each of which are hereby incorporated by reference as if fully cited herein. This application is a continuation-in-part of U.S. application Ser. No. 12/556,029 filed Sep. 9, 2009, which is a non-provisional application of U.S. provisional application No. 61/095,615 filed Sep. 9, 2008 each of which are hereby incorporated by reference as if fully cited herein. This application is a continuation-in-part of U.S. application Ser. No. 12/234,307 filed Sep. 19, 2008, which is a non-provisional application of U.S. Application No. 61/033,064 filed Mar. 3, 2008, each of which are hereby incorporated by reference in their entirety as if fully cited herein. This application is a continuation-in-part of U.S. application Ser. No. 12/234,360 filed Sep. 19, 2008, which is a non-provisional application of U.S. Application No. 61/053,713 filed May 16, 2008 each of which are hereby incorporated by reference in their entirety as if fully cited herein. This application is a continuation-in-part of U.S. application Ser. No. 12/237,365 filed Sep. 24, 2008, which is a non-provisional application of U.S. Application No. 61/057,599 filed May 30, 2008 each of which are hereby incorporated by reference in their entirety as if fully cited herein. This application is a continuation-in-part of U.S. application Ser. No. 12/235,200 filed Sep. 22, 2008, which is a non-provisional of U.S. Application No. 61/076,126 filed Jun. 26, 2008 each of which are hereby incorporated by reference in their entirety as if fully cited herein. This application is a continuation-in-part of U.S. application Ser. No. 12/620,330 filed Nov. 17, 2009, which is a non-provisional of U.S. Application No. 61/115,333 filed Nov. 17, 2008 each of which are hereby incorporated by reference in their entirety as if fully cited herein. This application is a continuation-in-part of U.S. application Ser. No. 12/556,209 filed Sep. 9, 2009, which is a non-provisional application of U.S. provisional application No. 61/095,616 filed Sep. 9, 2008 each of which are hereby incorporated by reference as if fully cited herein.

TECHNICAL FIELD

Exemplary embodiments generally relate to cooling systems and in particular to cooling systems for electronic displays.

BACKGROUND OF THE ART

Conductive and convective heat transfer systems for electronic displays are generally known attempt to remove heat from the electronic components in a display through as many sidewalls of the display as possible. In order to do this, some systems of the past have relied primarily on fans for moving air past the components to be cooled and out of the display. While such heat transfer systems have enjoyed a measure of success in the past, improvements to displays require even greater cooling capabilities.

Modern displays have become extremely bright, with some backlights producing 2,000 nits or more. In order to produce this level of brightness, illumination devices such as CCFL assemblies, LEDs, organic LEDs, and plasma assemblies may produce a relatively large amount of heat. Further, the illumination devices require a relatively large amount of power in order to generate the required brightness level. This large amount of power is typically supplied through one or more power supplies for the display. These power supplies may also become a significant source of heat for the display.

Further, displays of the past were primarily designed for operation near room temperature. However, modern displays have become capable of withstanding large surrounding environmental temperature variations. For example, some displays are capable of operating at temperatures as low as −22 F. and as high as 113 F. When surrounding temperatures rise, the cooling of the internal display components can become even more difficult.

Still further, in some situations radiative heat transfer from the sun through a front display surface can also become a source of heat. In some locations 200 Watts or more through such a front display surface is common. Furthermore, the market is demanding larger screen sizes for displays. With increased electronic display screen size and corresponding front display surfaces, more heat will be generated and more heat will be transmitted into the displays.

SUMMARY OF THE EXEMPLARY EMBODIMENTS

Exemplary embodiments relate to a system for cooling the following portions of an electronic display, either alone or in combination: (1) power module(s), (2) backlight, and (3) front display surface. Power modules with heat dissipating assemblies (ex. cold plates and/or heat sinks) may be used with some embodiments where the side of the power module containing the heat dissipating assembly is placed in the path of moving air while the side of the power module containing sensitive electrical components remains in a separate environment. An isolating structure may provide the necessary gaseous isolation between the two sides of the power modules.

Backlights with a front and rear sides may be used with some embodiments where the front side contains the illumination devices and the rear side contains a metallic surface for dissipating the heat from the illumination devices. Ideally, there should be a low level of thermal resistance between the front and rear sides of the backlights.

An exemplary embodiment may include an isolated gas cooling chamber for cooling the front display surface. The gas cooling chamber is preferably a closed loop which includes a first gas chamber comprising a transparent anterior plate and a second gas chamber comprising a cooling plenum. The first gas chamber is anterior to and coextensive with the viewable face of the electronic display surface. The transparent anterior plate may be set forward of the electronic display surface by spacers defining the depth of the first gas chamber. A cooling chamber fan, or equivalent means, maybe located within the cooling plenum. The fan may be used to propel gas around the isolated gas cooling chamber loop. As the gas traverses the first gas chamber it contacts the front display surface, absorbing heat from the front surface of the display. Because the gas and the relevant surfaces of the first gas chamber are transparent, the image quality remains excellent. After the gas has traversed the transparent first gas chamber, the gas may be directed into the rear cooling plenum.

In order to cool the gas in the plenum, external convective or conductive means may be employed. In at least one embodiment, an external fan unit may also be included within the housing of the display. The external fan unit may be positioned to provide a flow of ingested air over the external surfaces of the plenum. The heated air in the housing may exit the housing as exhaust. Other embodiments may use a heat exchanger to cool the isolated gas within the plenum.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which:

FIG. 2 is a perspective view of air flowing over a power module mounted in an isolating structure.

FIG. 3A is a top perspective view of air flowing between a backlight assembly and the isolating structure.

FIG. 3B is bottom perspective view of air flowing between a backlight assembly and the isolating structure.

FIG. 4 is a perspective view of the embodiment shown in FIG. 3A-3B with the addition of a heat sink to the power module baseplate.

FIG. 5 is an exploded perspective view of an embodiment of the isolated gas cooling system.

DETAILED DESCRIPTION

Embodiments provide a plurality of different systems and methods for cooling electronic displays. Embodiments may be used for displays which are operated near room temperature. Exemplary embodiments may be used with displays which are operated outdoors and even in direct sunlight. Performance in temperatures as high as 113° F. and above are possible.

It is to be understood that the spirit and scope of the disclosed embodiments provides for the cooling of many types of displays. By way of example and not by way of limitation, embodiments may be used in conjunction with any of the following: LCD (all types), light emitting diode (LED), organic light emitting diode (OLED), field emitting display (FED), and plasma displays. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition (1080i or 1080p or greater) liquid crystal displays (LCD). While the embodiments described herein are well suited for outdoor environments, they may also be appropriate for indoor applications (e.g., factory/industrial environments, spas, locker rooms) where thermal stability of the display may be at risk.

Figure 1:
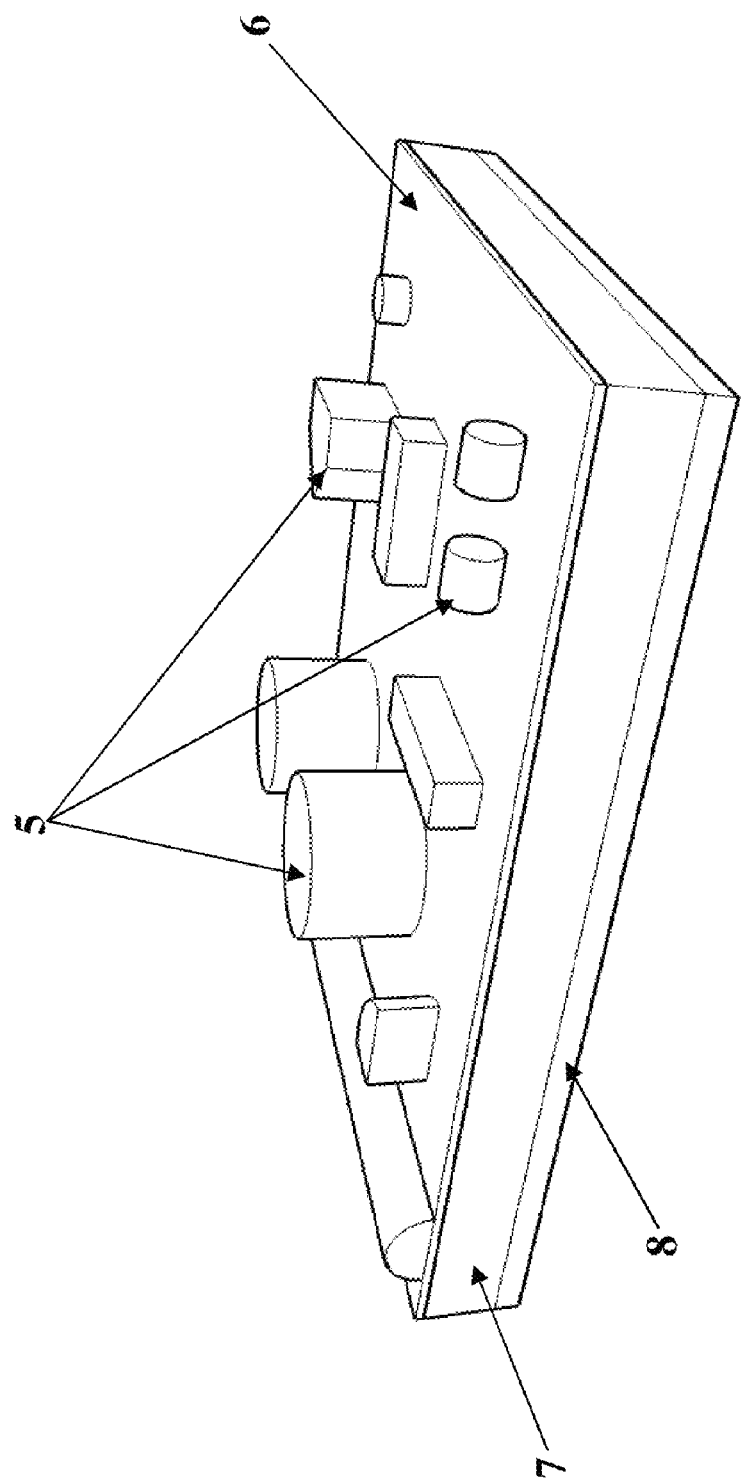
FIG. 1 is a perspective view of an exemplary power module.

FIG. 1 shows an embodiment of a power module 7 which may be used with some exemplary embodiments. A printed circuit board 6 may be attached to the power module 7 and may contain a plurality of electronic components 5 which may be necessary to operate and control the power module 7. These electronic components 5 may include, but are no means limited to resistors, capacitors, op-amps, wire harnesses, connectors, and inductors. A baseplate 8 may be attached to the power module 7 and may act as a heat dissipating assembly for the power module 7, such that heat which is generated by the power module 7 is transferred to the baseplate 8. In some embodiments there may be more components used, such as a conductive pad located between the power module and the baseplate 8. Also, as discussed further below, any type of heat sink or fin assembly may be used with the baseplate 8 to further enhance its thermodynamic properties. There may be conductive pads placed between the baseplate 8 and a heat sink assembly also.

Many types of power modules may be used with the embodiments described herein. An exemplary power module would be any type which uses heat dissipating assemblies. An exemplary power module is commercially available from TDK-Lambda of San Diego, Calif. www.lambdapower.com. Specifically, the PFE series of power modules could be used with exemplary embodiments.

FIG. 2 shows two power modules installed within an isolating structure 9 which substantially prevents gaseous communication between the two sides of the power module. The baseplates 8 of the power modules are shown on the side of the isolating structure 9 where ambient gas 4 may be used to pass over the baseplates 8. Gaskets 11 may be used to provide a gaseous seal between the power modules and the isolating structure 9. The ambient gas 4 is sometimes drawn from the environment surrounding the display and may or may not be treated or filtered. This environment may contain harmful contaminates which could damage various electrical components in the display. These harmful contaminates include, but are not limited to: dust, smoke, pollen, water vapor, other harmful particulate and other harmful gases. Thus, one of the purposes for the isolating structure 9 is to prevent the ambient gas 4 from contacting some of the sensitive electronic components of the display, including but not limited to the electronic components 5 which are required to operate and control the power modules. By mounting the power modules within the isolating structure 9, ambient gas 4 can be drawn into the display housing and forced over the baseplates and optional heatsinks and fins in order to cool the power modules. This can be accomplished without exposing sensitive electronic components to the potentially harmful ambient gas 4.

FIG. 3A shows an embodiment where the ambient gas 4 may be used to cool both the power modules and the backlight assembly 140. This embodiment shows a backlight assembly 140 which is comprised of a plurality of LEDs 141 which are mounted to a mounting substrate, preferably a printed circuit board (PCB). An exemplary embodiment would use a metal core PCB or any other mounting structure which would have a relatively low level of thermal resistance so that heat can transfer from the LEDs 141 to the rear surface of the backlight assembly 140 where it can be removed by the ambient gas 4. It should be noted that this type of backlight assembly is not required, as other types including but not limited to CCFL backlights can also be used. Further, a backlight assembly may not even be necessary for some embodiments such as plasma and OLED displays. However, these display types are also known to generate heat and where backlight cooling is described in this application these methods could also be applied to the cooling of rear surfaces of these display assemblies. Thus, where backlight assemblies are shown, a plasma or OLED display assembly could be substituted.

FIG. 3B shows the rear view of the embodiment shown in FIG. 3A. From this view, the electronic components 5 are shown as being isolated from the ambient gas 4.

FIG. 4 shows an embodiment which is similar to that which was shown in FIGS. 3A-3B with the exception that a heat sink 12 is now being used with the power modules in order to further facilitate the transfer of heat away from the power modules. It should of course be noted that many types of heat sinks are available which are made of many different materials and have many different geometry types. Any form of heat sink is particularly contemplated with various embodiments and may satisfy different operating conditions.

FIG. 5 shows an exemplary embodiment for an electronic display 10 which includes an isolated gas cooling system 20 contained within an electronic display housing 70. A narrow transparent first gas chamber is defined by spacers 100 and transparent front plate 90. A second transparent front plate 130 may be laminated to front plate 90 to help prevent breakage of front plate 90 (or provide optical properties). The isolated gas cooling system 20 may surround the display assembly 80 and associated backlight assembly 140 (if the backlight is necessary). If used with an LCD display, the display assembly 80 may comprise an LCD stack.

The isolated gas cooling system 20 may include a means for cooling the isolated gas contained within the second gas chamber 40. This means may include one or more fans 60 which may be positioned at the base of the display housing 70. The fans may force ambient gas 4 (shown in FIG. 6) over at least one external surface of a cooling plenum 45. If desired, an air conditioner (not shown) may also be utilized to cool the air prior to contacting the air with the external surfaces of the plenum 45. Surface features such as fins or heat sinks (not shown) may be placed on the exterior surfaces of the plenum 45 to further aid the plenum's ability to dissipate heat. Alternatively, a heat exchanger may be used to cool the isolated gas contained within the second gas chamber 40. The heat exchanger system described in co-pending application 61/138736 filed on Dec. 18, 2008 may be used with any of the isolated gas cooling systems referenced herein and this application is herein incorporated by reference in its entirety.

Figure 6:
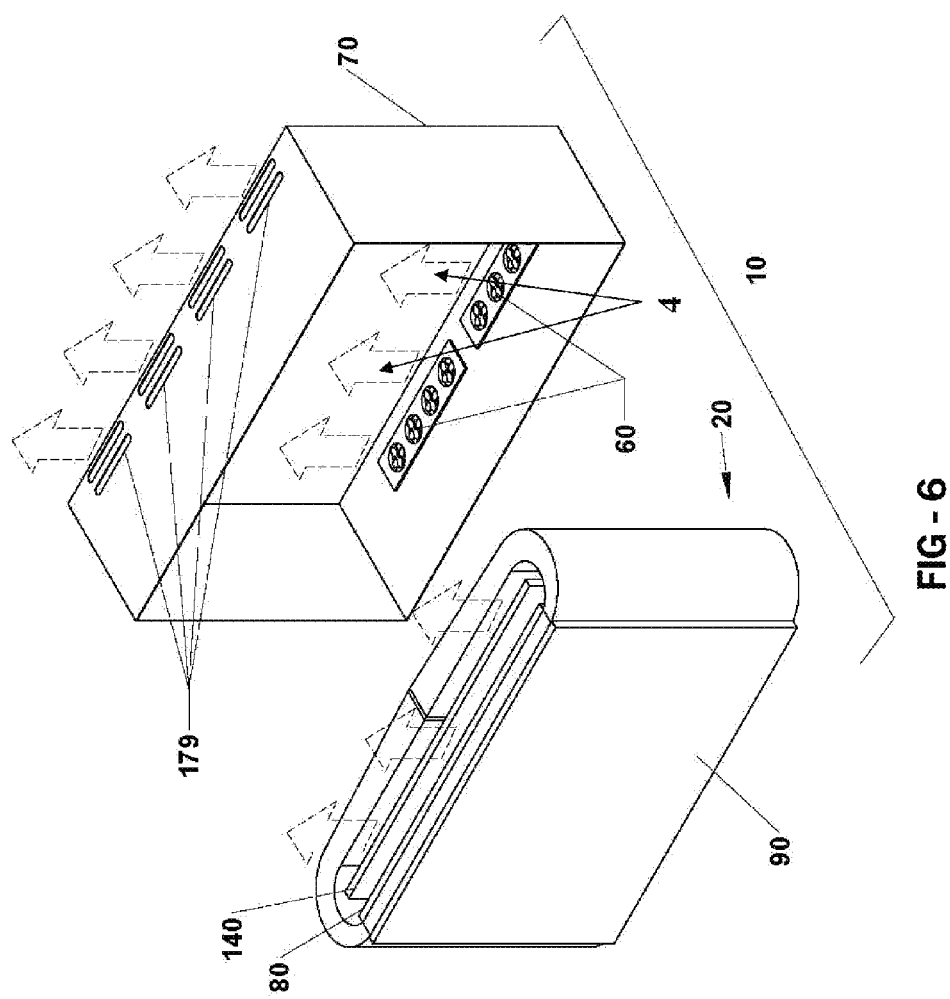
FIG. 6 is a perspective view of an embodiment of the isolated cooling system showing fans in the housing which may blow ingested gas over the exterior surfaces of the second gas chamber.

FIG. 6 shows one method for removing heat from the isolated gas contained in the rear plenum 45. One or more fans 60 may be positioned to ingest ambient gas 4 and blow that ambient gas 4 into the display housing 70. Preferably, the ambient gas will contact the front and rear surfaces of the plenum 45. Furthermore, in this configuration, fans 60 may also force ambient gas 4 past the heat generating components of the electronic display (e.g., the display assembly 80 and the backlight assembly 140) to further improve the cooling capability of the overall system. The heated exhaust air may exit through one or more exhaust apertures 179 located on the display housing 70. The ingested ambient gas 4 may be air conditioned prior to being ingested into the display housing 70. As discussed further below, one or more air-drawing fans 17 (shown in FIGS. 10 and 11) may be used instead of, or in addition to the fans 60 in order to draw ingested ambient gas in between the backlight assembly 140 and the cooling plenum 45, between the backlight assembly 140 and an isolating structure 9, or between a display assembly 80 and an isolating structure 9.

Figure 7:
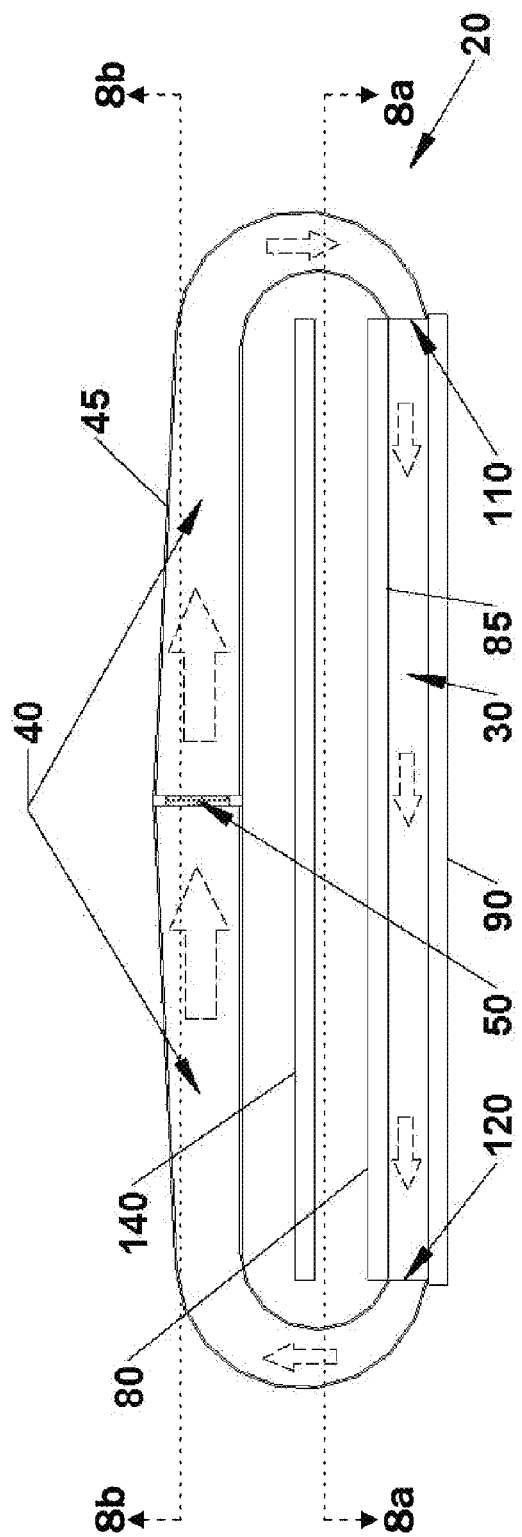
FIG. 7 is a top plan view of an exemplary embodiment of the isolated gas cooling system showing the closed loop of isolated gas and section planes 8*a*-8*a* and 8*b*-8*b*.

As shown in FIG. 7, the isolated gas cooling system 20 may comprise a closed loop which includes a first gas chamber 30 and a second gas chamber 40. The first gas chamber includes a transparent plate 90. The second gas chamber comprises a cooling plenum 45. The term "isolated gas" refers to the fact that the gas within the isolated gas cooling chamber 20 is essentially isolated from ambient gas which may be drawn into the housing of the display. Because the first gas chamber 30 is positioned in front of the display image, the gas should be substantially free of dust or other contaminates that might negatively affect the display image.

The isolated gas may be almost any transparent gas, for example, normal air, nitrogen, helium, or any other transparent gas. The gas is preferably colorless so as not to affect the image quality. Furthermore, the isolated gas cooling system 20 need not necessarily be hermetically sealed from the external air. It is sufficient that the gas is isolated to the extent that dust and contaminates may not substantially enter the first gas chamber. One or more filters (not shown) may also be used to ensure that any contaminates which may enter the isolated gas system become trapped and cannot impair the image quality.

The first gas chamber 30 is in gaseous communication with the second gas chamber 40. One or more cooling chamber fans 50 may be provided within the second gas chamber 40. The cooling fans 50 may be utilized to propel gas around the isolated gas cooling chamber 20. The first gas chamber 30 includes at least one transparent front plate 90 mounted in front of an electronic display surface 85. The front plate 90 may be set forward from the electronic display surface 85 by spacers 100 (see FIG. 5). The spacing members 100 may define the depth of the channel passing in front of the electronic display surface 85. The spacing members 100 may be independent or alternatively may be integral with some other component of the device (e.g., integral with the front plate). The electronic display surface 85, the spacing members 100, and the transparent front plate 90 may define a first gas chamber 30. The chamber 30 is in gaseous communication with the second chamber 40 through entrance opening 110 and exit opening 120.

A rear surface of the first gas chamber 30 preferably comprises the electronic display surface 85 of the display assembly 80. As the isolated gas in the first gas chamber 30 traverses the display it contacts the electronic display surface 85. Contacting the isolated gas directly to the electronic display surface 85 enhances the convective heat transfer away from the electronic display surface 85.

The electronic display surface 85 of a typical display is glass. However, neither electronic display surface 85, nor transparent front plate 90, nor optional second transparent front plate 130 need necessarily be glass. By utilizing the electronic display surface 85 as the rear surface wall of the first gas chamber 30, there may be fewer surfaces to impact the visible light traveling through the display. Furthermore, the device will be lighter and cheaper to manufacturer. This is not necessary however.

Although the embodiment shown utilizes the electronic display surface 85 as the rear surface of the first gas chamber 30, certain modifications and/or coatings (e.g., anti-reflective coatings) may be added to the electronic display surface 85, or to other components of the system in order to accommodate the isolated gas or to improve the optical performance of the device. In the embodiment shown, the electronic display surface 85 may be the front glass plate of a liquid crystal display (LCD) stack. However, almost any display surface may be suitable for embodiments of the present cooling system, including but not limited to plasma and OLED displays. Although not required, it is preferable to allow the isolated gas in the first gas chamber 30 to contact the electronic display surface 85 directly. In this way, the convective effect of the isolated gas will be maximized and heat can be more effectively removed from the display assembly itself. Preferably the isolated gas, which has absorbed heat from the electronic display surface 85 may then be diverted to the cooling plenum 45 where the collected heat energy in the gas may be dissipated into the walls of the plenum 45 where it can then be transferred to the surrounding air and exhausted from the display housing 70.

Although the isolated gas cooling system 20 may be designed to move the gas in either a horizontal or a vertical direction, it is preferable to propel the gas in a horizontal direction. In this way, if dust or contaminates do enter the first gas chamber 30, they will tend to fall to the bottom of chamber 30 outside of the viewable area of the display. The system may move air left to right, or alternatively, right to left.

Section line 8a-8a is shown which removes all portions of the isolated gas system 20 from the section line towards the front of the display. Section line 8b-8b is also shown which removes the rear wall of the second gas chamber 40.

Figure 8:
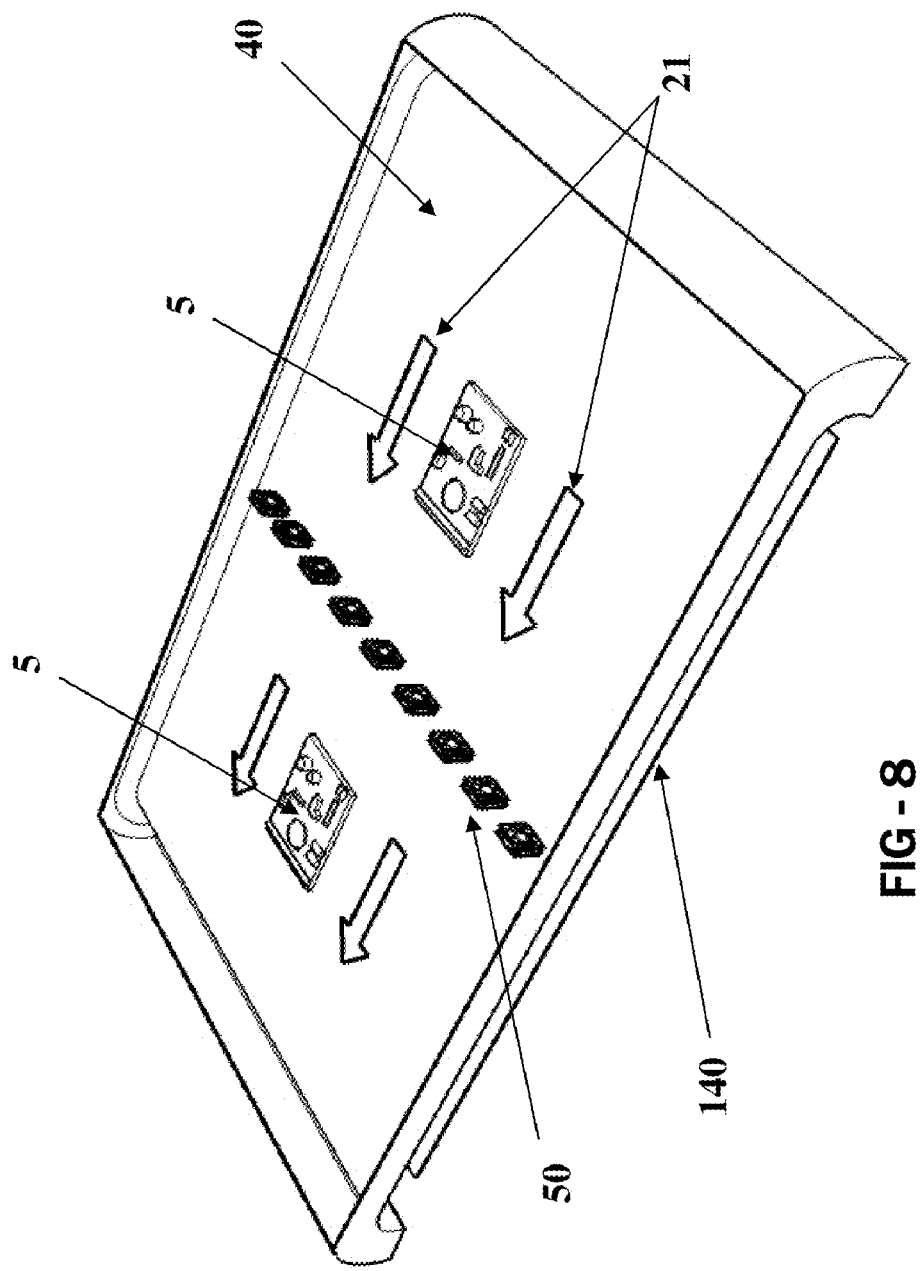
FIG. 8 is a perspective view of an embodiment of the isolated gas cooling system with sections 8*a*-8*a* and 8*b*-8*b* removed with power modules mounted within the front wall of the second gas chamber.

FIG. 8 shows a perspective view of the interior of the second gas chamber 40. In this embodiment, power modules are mounted within the front wall of the second gas chamber 40. Cooling chamber fans 50 propel the isolated gas 21 around the isolated gas cooling system. Here, the electronic components 5 of the power modules are exposed to the isolated gas 21 for additional cooling. The isolated gas 21, as discussed at length above, is designed to be substantially free of contaminates and thus should be permitted to contact the electronic components 5 without the risk of damage. At the same time, ambient gas (not shown) may be forced between the backlight assembly 140 (or display assembly) and the exterior wall of the second gas chamber 40 (plenum) and may contact power module baseplates 8 (not shown) or heat sinks 12 (not shown) in order to further cool the power modules.

Any of the isolated gas systems described in any of the co-pending application Ser. No. 12/234,307 filed on Sep. 19, 2008, Ser. No. 12/234,360 filed on Sep. 19, 2008, Ser. Nos. 12/237,365 filed on Sep. 24, 2008, and 61/115,333 filed on Nov. 17, 2008, and Ser. No. 12/641,468 filed on Dec. 18, 2009 may be used with any of the embodiments herein and are herein incorporated by reference in their entirety. Specifically, a cross-flow heat exchanger may be substituted for the second gas chamber 40 shown in FIG. 8.

Figure 9:
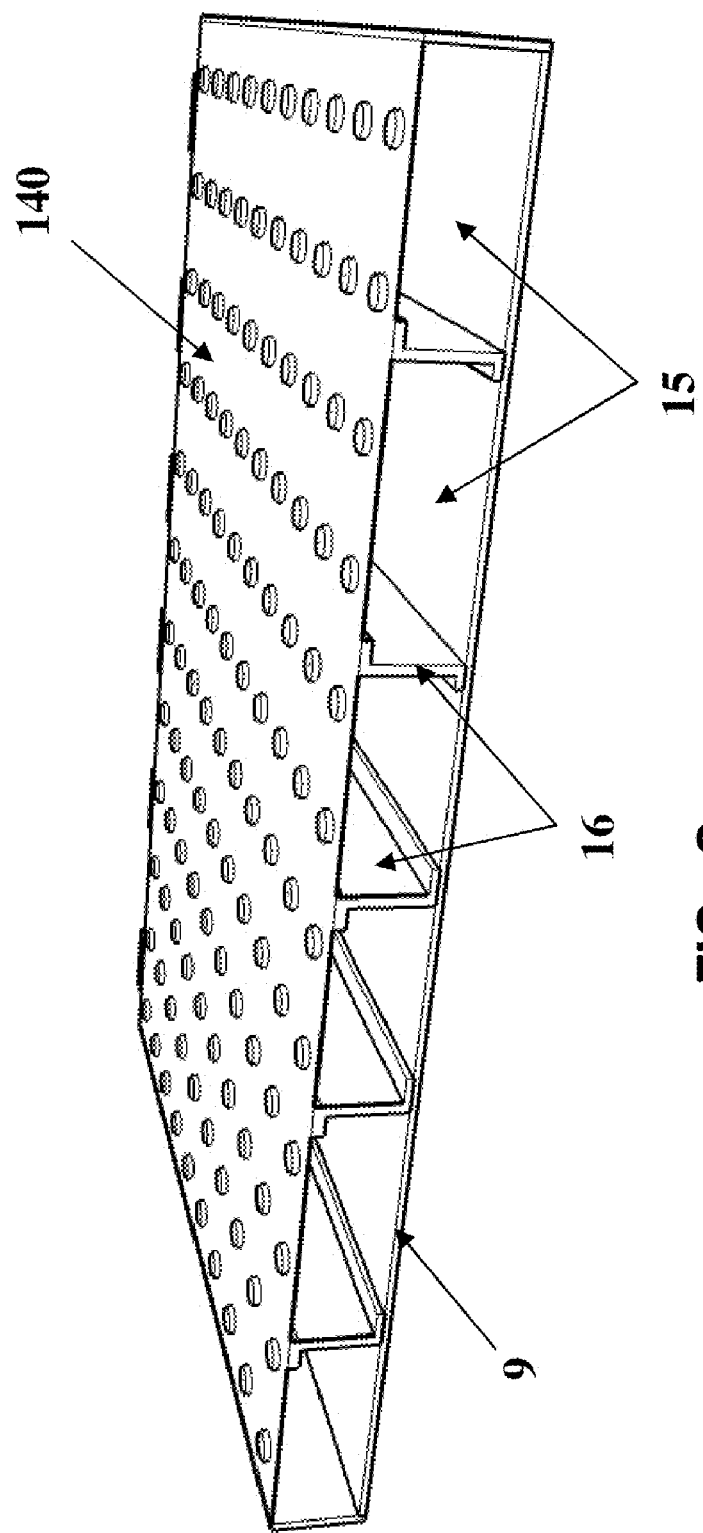
FIG. 9 is a bottom perspective view of an embodiment where a plurality of cooling channels are created between the backlight assembly and the isolating structure.

FIG. 9 shows an exemplary embodiment where a plurality of channels 15 are created between the backlight assembly 140 and the isolating structure 9. Channel separators 16 may be used to separate each channel 15 and provide structural rigidity to the overall assembly. The channel separators 16 should preferably be fabricated out of thermally conductive material so that they may also transfer heat between the backlight assembly 140 and the isolating structure 9. A thermally conductive channel separator 16 can also extract heat from either the backlight assembly 140 or the isolating structure 9 and may dissipate the heat into the air moving through the channel 15. Thus, some channel separators 16 may contain fins or heat sinks in order to facilitate heat transfer to the air moving through the channel 15.

Figure 10:
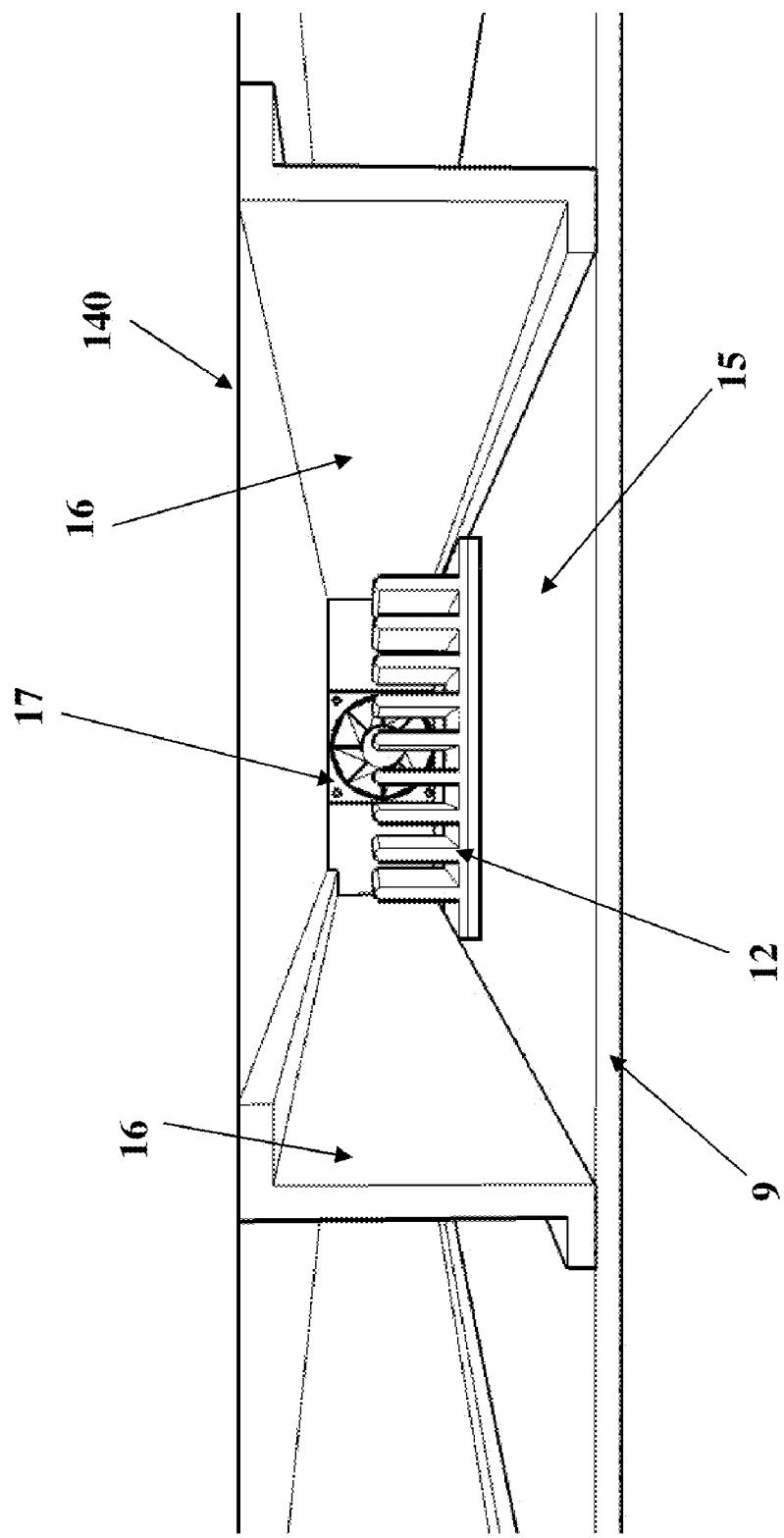
FIG. 10 is bottom plan view of an exemplary embodiment of a cooling channel containing a power module.

FIG. 10 shows a view down a single channel 15 which contains the heat sink 12 for a power module which is mounted within the isolating structure 9. Some channels 15 may contain power modules and others may not. A channel fan 17 may be used to draw air through the channel in order to cool the heat sink 12 (if used) and the channel separators 16 (if thermally conductive). Each channel 15 may contain one or more channel fans 17. Some channels may not contain a fan at all, but may rely solely on natural convection to allow heat to rise and exit the channel. Alternatively, fans 60 (not shown) near the base of the display may be used instead of or in addition to the channel fans 17.

Figure 11:
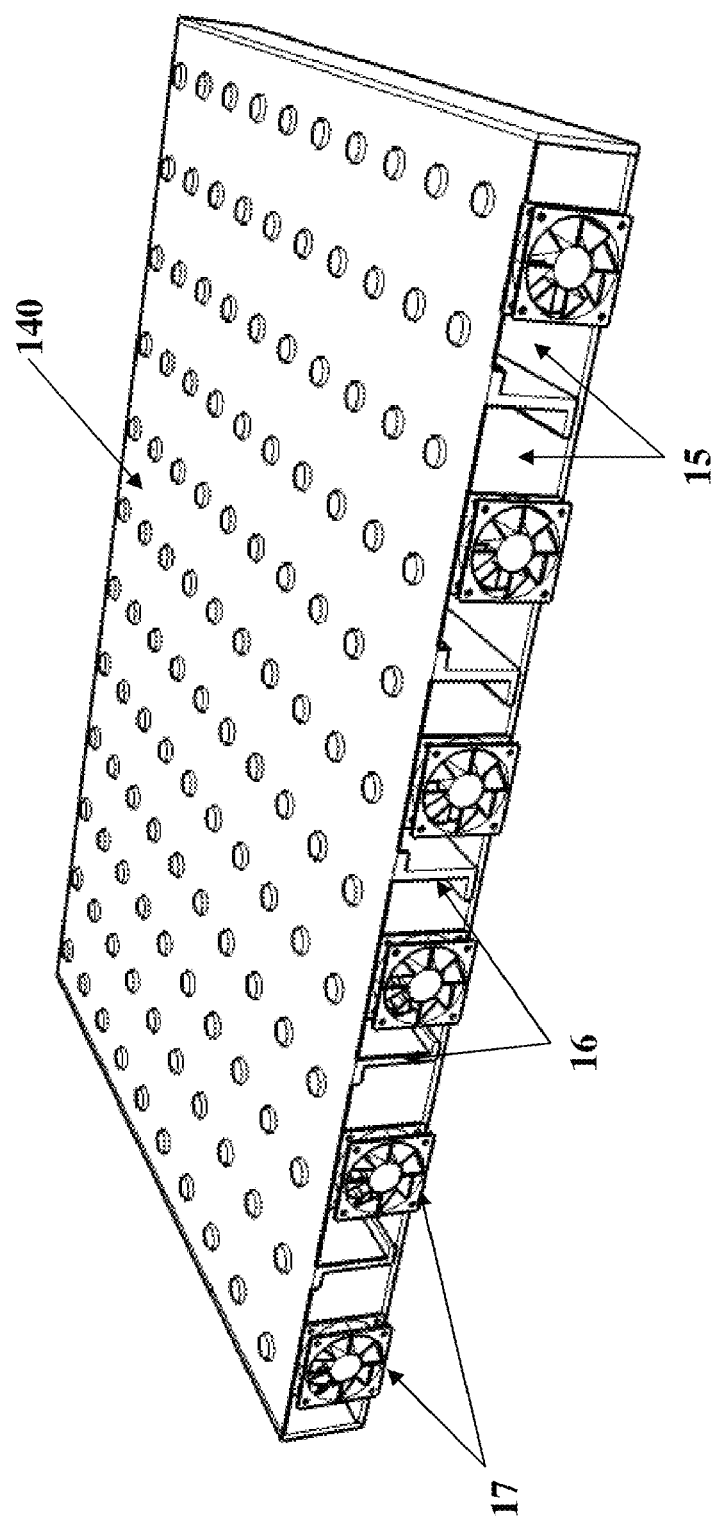
FIG. 11 is a top perspective view of an embodiment where a fan is placed at the top of each cooling channel.

FIG. 11 shows an embodiment where a channel fan 17 is used with each channel 15. While the display is in operation, the channel fans 17 may run continuously. Alternatively, temperature sensing devices (not shown) may be placed in each channel and used to measure the temperature of the air within the channel or any of the channel components (backlight or display assembly, isolating structure, or channel separators). Based on information received from these temperature sensing devices, the various fans may be selectively engaged depending on which channel requires cooling. Thus, fans 17 which draw air through channels 15 which contain power modules may run more often or at higher speeds due to the greater amount of heat coming from the power modules. Also, channels which contain power modules may contain larger fans or a plurality of fans in order to cool the channel.

Furthermore, the isolated gas cooling system may also run continuously. However, if desired, temperature sensing devices (not shown) may be incorporated within the electronic display to detect when temperatures have reached a predetermined threshold value. In such a case, the cooling chamber fans 50 may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

The various embodiments shown can be combined in a number of ways to provide adequate thermal regulation of displays which may be used in a number of different environments. Further, measuring the temperature at various points in the display and selectively engaging the various fans or cooling systems allows the display to use less energy by selectively cooling only portions of the display. This will also increase the life of any cooling fans as they will not be required to run continuously.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. A cooling system for an electronic display assembly comprising:
   an isolating structure placed behind the electronic display assembly;
   a channel defined by the space between the isolating structure and the electronic display assembly;
   a power module having electronic components on a first side and a baseplate on the second side, where the power module is attached to the isolating structure so that the baseplate is within the channel and the electronic components are outside the channel;
a heat sink attached to the baseplate; and
a fan positioned so as to draw ambient gas through the channel.

2. The cooling system of claim 1 further comprising:
a rib placed within the channel.

3. The cooling system of claim 1 further comprising:
a gasket surrounding the power module.

4. A light-emitting diode (LED) assembly comprising:
a mounting substrate;
a plurality of LEDs mounted on the front side of the mounting substrate;
an isolating structure placed behind the mounting substrate;
a channel defined by the space between the isolating structure and the mounting substrate;
a power module having electronic components on a first side and a heat sink on the second side, where the power module is attached to the isolating structure so that the heat sink is within the channel and the electronic components are outside the channel; and
a fan positioned so as to draw ambient gas through the channel.

5. The LED assembly of claim 4 further comprising:
a thermally-conductive surface placed on the rear surface of the mounting substrate.

6. The LED assembly of claim 4 wherein:
the mounting substrate is a printed circuit board (PCB).

7. The LED assembly of claim 4 wherein:
the mounting substrate is metallic.

8. The LED assembly of claim 4 wherein:
the mounting substrate is a metal core PCB.

9. The LED assembly of claim 4 further comprising:
a rib placed within the channel.

10. The LED assembly of claim 4 further comprising:
a gasket surrounding the power module.

11. An electronic image assembly comprising:
an electronic display assembly having a front and rear portion;
a surface on the rear portion of the electronic image assembly and in thermal communication with the electronic display assembly;
an isolating structure spaced apart from the surface;
a first channel defined by the space between the isolating structure and the surface;
a power module having electronic components on a first side and a heat sink on the second side, where the power module is attached to the isolating structure so that the heat sink is within the channel and the electronic components are outside the channel; and
a first fan positioned so as to draw ambient gas through the first channel.

12. The electronic image assembly of claim 11 further comprising:
a rib placed within the first channel.

13. The electronic image assembly of claim 11 further comprising:
a front display surface spaced apart from the front portion of the electronic display assembly;
a second channel defined by the space between the front display surface and the front portion of the electronic display assembly;
a heat exchanger in gaseous communication with the second channel, the heat exchanger having first and second gas pathways, where the first gas pathway is in gaseous communication with the second channel;
a second fan positioned so as to force ambient gas through the second gas pathway; and
a third fan positioned so as to force circulating gas through the second channel and the first gas pathway.

14. The electronic image assembly of claim 11 wherein:
the electronic display assembly is a LCD.

15. The electronic image assembly of claim 11 wherein:
the electronic display assembly is an OLED.

16. The electronic image assembly of claim 11 wherein:
the electronic display assembly is an LED-backlit LCD.

17. The electronic image assembly of claim 11 wherein:
the surface on the rear portion of the electronic image assembly is the rear surface of an LED backlight.

* * * * *